(12) United States Patent
Ha

(10) Patent No.: US 7,443,752 B2
(45) Date of Patent: Oct. 28, 2008

(54) SEMICONDUCTOR MEMORY DEVICE AMPLIFYING DATA

(75) Inventor: Sung-Joo Ha, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 1 day.

(21) Appl. No.: 11/477,372

(22) Filed: Jun. 30, 2006

(65) Prior Publication Data

US 2007/0014171 A1  Jan. 18, 2007

(30) Foreign Application Priority Data

Sep. 28, 2005  (KR) ............... 10-2005-0090863
Dec. 7, 2005  (KR) ............... 10-2005-0118918

(51) Int. Cl.
*G11C 7/02* (2006.01)

(52) U.S. Cl. ............ 365/208; 365/227; 365/233.5; 365/207; 365/189.06

(58) Field of Classification Search .......... 365/207, 365/208, 227, 235.5, 189.06; 327/51, 52
See application file for complete search history.

(56) References Cited

U.S. PATENT DOCUMENTS

| | | | | |
|---|---|---|---|---|
| 4,972,374 A * | 11/1990 | Wang et al. | .......... | 365/205 |
| 5,015,891 A * | 5/1991 | Choi | .......... | 327/53 |
| 5,146,427 A * | 9/1992 | Sasaki et al. | .......... | 365/189.05 |
| 5,289,415 A * | 2/1994 | DiMarco et al. | .......... | 365/190 |
| 5,650,971 A * | 7/1997 | Longway et al. | .......... | 365/207 |
| 5,661,691 A * | 8/1997 | Lin | .......... | 365/208 |
| 5,828,239 A * | 10/1998 | Lotfi | .......... | 327/51 |
| 5,936,897 A * | 8/1999 | Koga | .......... | 365/190 |
| 6,249,469 B1 | 6/2001 | Hardee | | |
| 6,314,029 B1 | 11/2001 | Ko et al. | | |
| 6,611,446 B2 | 8/2003 | Kawasumi | | |
| 6,876,595 B2 * | 4/2005 | Bhavnagarwala et al. | .......... | 365/230.06 |
| 2001/0015931 A1* | 8/2001 | Lee | .......... | 365/230.03 |
| 2002/0071302 A1* | 6/2002 | Kawasumi | .......... | 365/63 |
| 2005/0088882 A1 | 4/2005 | Lim | | |

FOREIGN PATENT DOCUMENTS

JP  2000-306383  11/2000
JP  2001-93276  4/2001

* cited by examiner

*Primary Examiner*—Huan Hoang
*Assistant Examiner*—Jay Radke
(74) *Attorney, Agent, or Firm*—McDermott Will & Emery LLP

(57) ABSTRACT

A semiconductor memory device includes an I/O line, a first sense amplifier connected to the first I/O line to amplify a signal applied on the first I/O line in response to a first control signal, a second sense amplifier for amplifying an output signal of the first sense amplifier in response to a second control signal, and a disabling unit for disabling the first control signal in response to an output signal of the second sense amplifier.

28 Claims, 5 Drawing Sheets

SEMICONDUCTOR MEMORY DEVICE AMPLIFYING DATA

FIELD OF THE INVENTION

The present invention relates to a semiconductor memory device; and, more particularly, to an I/O line sense amplifier for sensing and amplifying data of I/O line.

DESCRIPTION OF RELATED ARTS

Generally, semiconductor memory devices use input/output (I/O) lines to transfer data. I/O data lines for data transfer between data I/O pads and cell area or core area are called global data line (GIO). The global data lines (GIO) are globally arranged throughout a plurality of banks. An output of a bit line sense amplifier is transferred to the global data line through a local data line (LIO).

A circuit for transferring data between the global data line and the local data line is required. In the case of DRAM, in a read operation, an I/O sense amplifier (IOSA) is used to transfer data of the local data line to the global data line. In a write operation, a write driver is used to transfer the data of the global data line to the local data bus.

The read operation outputs data out of a chip. The read operation has great influence on the operating speed of the chip. To increase the speed of the read operation, a two-stage amplification scheme has been proposed.

FIG. 1 is a block diagram of a conventional two-stage I/O sense amplifier amplifier.

Referring to FIG. 1, a bit line sense amplifier 10 senses and amplifies data of bit lines BL and BLB and transfers the amplified data to local I/O lines LIO and LIOB. A column decoder (Y DEC) 20 decodes a column address and a column pulse and outputs a column address pulse YI PULSE to the bit line sense amplifier 10. A first-stage sense amplifier 30 primarily senses and amplifies the data of the local I/O lines LIO and LIOB. A second-stage sense amplifier 40 secondarily senses and amplifies output signals D0 and D0B of the first-stage sense amplifier 30. A GIO driver 50 outputs data to the global I/O lines in response to output signals D1 and D1B of the second-stage sense amplifier 40. A first control signal generator 60 receives the column pulse signal Y PULSE to output a control signal IOSTB1 to the first-stage sense amplifier 30. A second control signal generator 70 receives the column pulse signal Y PULSE to output a control signal IOSTB2 to the second-stage sense amplifier 40.

In FIG. 1, a dotted block 100 represents the two-stage sense amplifier.

FIG. 2 is a timing diagram of the two-stage sense amplifier of FIG. 1.

Referring to FIG. 2, in a read operation, the column decoder 20 receives the column address and the column pulse and outputs the column address pulse YI to the corresponding bit line sense amplifier 10. The bit line sense amplifier 10 senses and amplifies data of the bit lines BL and BLB and outputs the amplified data to the local I/O lines LIO and LIOB. Because the line loading of the local I/O lines LIO and LIOB is relatively large compared with the drivability of the bit line sense amplifier 10, the level difference between the local I/O lines LIO and LIOB is very slight. The first-stage sense amplifier 30 amplifies the level difference between the local I/O lines LIO and LIOB by a predetermined gain. The first-stage sense amplifier 30 is generally configured with a differential type sense amplifier. Then, the amplified signal is amplified to a full swing or full logic level by the second-stage sense amplifier 40. The second-stage sense amplifier is generally configured with a cross-coupled type sense amplifier. This amplified signal is finally transferred to the global I/O line GIO through the global I/O driver 50.

In FIG. 1, the first-stage sense amplifier 30 and the second-stage sense amplifier 40 are controlled by the first control signal IOSTB1 and the second control signal IOSTB2, respectively. The first control signal generator 60 delays the column pulse for a predetermined time and generates the first control signal IOSTB1. The delay time secures the time at which the first-stage sense amplifier can operate after the column address pulse YI is output and the level difference between the local I/O lines LIO and LIOB is relatively large. The second control signal generator 70 generates the second control signal IOSTB2 while adjusting the output timing such that the second-stage sense amplifier 40 can operate after the first-stage sense amplifier performs the amplifying operation.

The conventional I/O line sense amplifier, however, has the following problems.

Referring to FIGS. 1 and 2, when the second-stage sense amplifier 40 is driven, the first-stage sense amplifier 30 need not operate. However, the two sense amplifiers may operate at the same time. Since the second-stage sense amplifier 40 is the cross-coupled type amplifier, a positive feedback occurs only if the amplifying operation begins. At this point, the first-stage sense amplifier may operate unnecessarily. Specifically, because pulse widths of the first and second control signals IOSTB1 and IOSTB2 are fixed, the first-stage sense amplifier 30 and the second-stage sense amplifier 40 are operated during these pulse widths. This can be seen from the timing diagram of FIG. 2. Because the second-stage sense amplifier 40 is a cross-coupled type amplifier, it does not continue to dissipate power once it performs the sensing operation. However, because the first-stage sense amplifier is a differential type amplifier, power is continuously dissipated during the operation of the first-stage sense amplifier. Therefore, after the positive feedback occurs in the second-stage sense amplifier 40, power is unnecessarily dissipated during the remaining period of the pulse width of the first control signal IOSTB1.

Consequently, this has a bad influence on power consumption, which presents a huge burden on mobile memory devices.

SUMMARY OF THE INVENTION

It is, therefore, an object of the present invention to provide a semiconductor memory device with low power consumption.

It is another object of the present invention to provide a semiconductor memory device that can suppress power consumption by stopping an unnecessary operation during a read operation.

It is a further another object of the present invention to provide a semiconductor memory device that can remarkably reduce power consumption by efficiently controlling the operations of I/O line sense amplifiers in a read operation.

It is a further object of the present invention to provide a semiconductor memory device that can minimize an overlap period in which sense amplifiers are driven together.

In accordance with an embodiment of the present invention, there is provided a semiconductor memory device including: a first input/output (I/O) line; a first sense amplifier connected to the first I/O line to amplify a signal applied on the first I/O line; a second sense amplifier for amplifying an output signal of the first sense amplifier; and a controller for controlling the first sense amplifier by feeding back an output signal of the second sense amplifier.

The controller stops an operation of the first sense amplifier in response to the output signal of the second sense amplifier.

The semiconductor memory device further includes a bias circuit between the first sense amplifier and the second amplifier, the bias circuit being configured to continuously drive the second sense amplifier when the operation of the first sense amplifier is stopped. The controller receives the output signal of the second sense amplifier not directly but via a driver. The first I/O line is a local I/O line.

In another aspect of the present invention, there is provided a semiconductor memory device including: a first I/O line; a first sense amplifier connected to the first I/O line to amplify a signal applied on the first I/O line; a second sense amplifier for amplifying an output signal of the first sense amplifier; and an enable timing controller for controlling a driving of the first sense amplifier in response to an output signal of the second sense amplifier. The enable timing controller stops an operation of the first sense amplifier in response to the output signal of the second sense amplifier. The semiconductor memory device further includes a bias circuit between the first sense amplifier and the second amplifier, the bias circuit being configured to continuously drive the second sense amplifier when the operation of the first sense amplifier is stopped. The enable timing controller receives the output signal of the second sense amplifier not directly but via a driver. The first I/O line is a local I/O line.

In accordance with a further embodiment of the present invention, there is provided a semiconductor memory device including: a first input/output (I/O) line; a first sense amplifier connected to the first I/O line to amplify a signal applied on the first I/O line in response to a first control signal; a second sense amplifier for amplifying an output signal of the first sense amplifier in response to a second control signal; and a disabling unit for disabling the first control signal in response to an output signal of the second sense amplifier. The disabling unit stops an operation of the first sense amplifier in response to the output signal of the second sense amplifier. The semiconductor memory device further includes a bias circuit between the first sense amplifier and the second amplifier, the bias circuit being configured to continuously drive the second sense amplifier when the operation of the first sense amplifier is stopped. The disabling unit receives the output signal of the second sense amplifier not directly but via a driver. The first I/O line is a local I/O line.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A semiconductor memory device in accordance with exemplary embodiments of the present invention will be described in detail with reference to the accompanying drawings.

Figure 3:
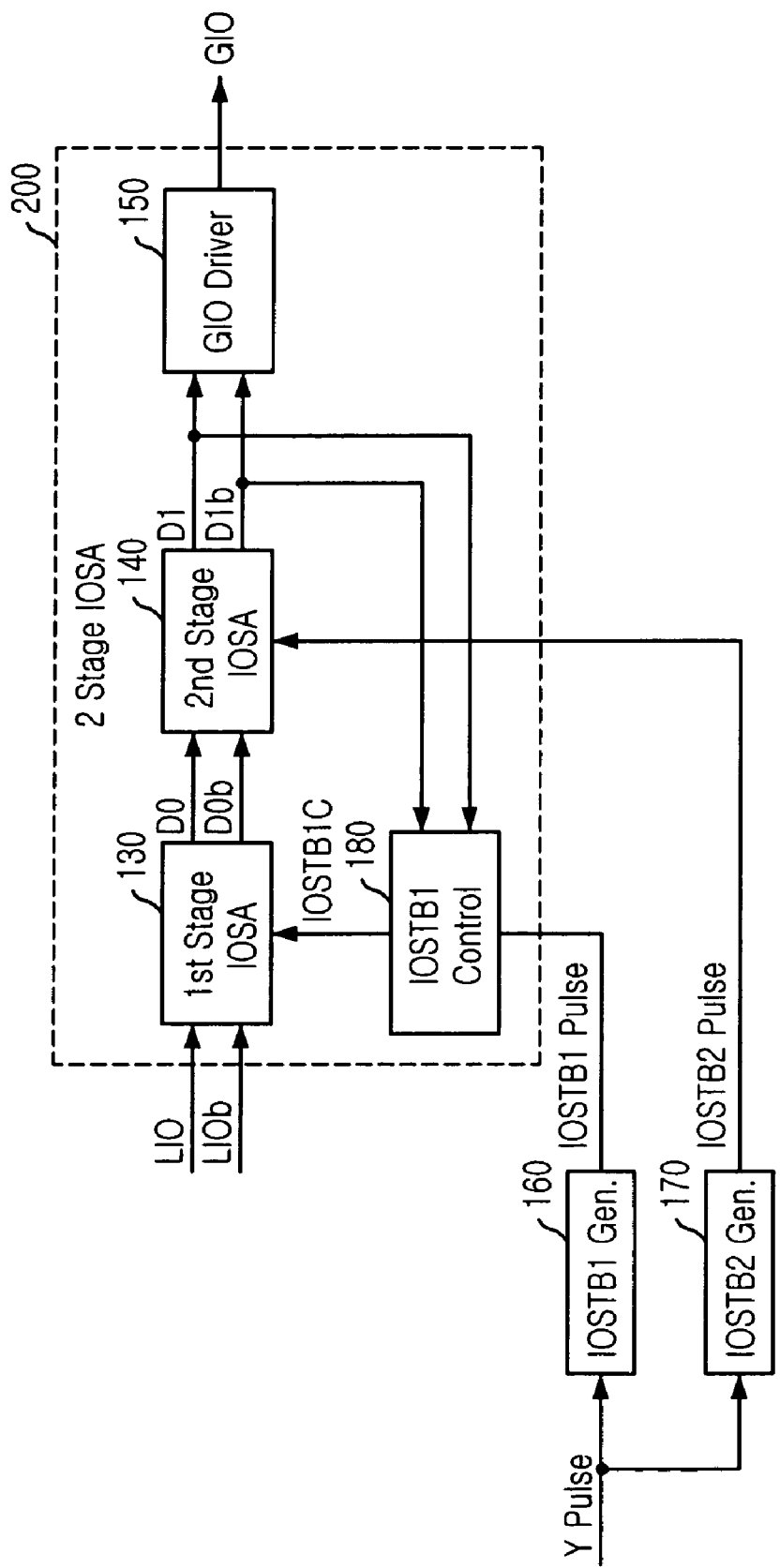
FIG. 3 is a block diagram of an I/O line sense amplifier in accordance with an embodiment of the present invention.

FIG. 3 is a block diagram of an I/O line sense amplifier of a semiconductor memory device in accordance with an embodiment of the present invention.

Referring to FIG. 3, a first-stage sense amplifier 130 primarily senses and amplifies data of local I/O lines LIO and LIOB, and a second-stage sense amplifier 140 secondarily senses and amplifies output signals D0 and D0B of the first-stage sense amplifier 130. A global I/O driver 150 outputs data to the global I/O lines in response to output signals D1 and D1B of the second-stage sense amplifier 140. A first control signal generator 160 receives a column pulse signal Y and outputs a first control signal IOSTB1 to the first-stage sense amplifier 130. A second control signal generator 170 outputs a second control signal IOSTB2 to the second-stage sense amplifier 140 in response to the column pulse signal Y. A driving controller 180 controls driving of the first-stage sense amplifier 130 in response to the output signals D1 and D1B of the second-stage sense amplifier 140.

In FIG. 3, a dotted block 200 represents a two-stage sense amplifier.

Referring to FIG. 3, it should be noted that the output signals D1 and D1B of the second-stage sense amplifier is fed back, and an enable period of the first-stage sense amplifier 130 is controlled by the feedback signal. Also, when controlling the enable period of the first-stage sense amplifier 130, the pulse width of the control signal IOSTB1C for the first-stage sense amplifier 130 is simply controlled. Therefore, the present invention can easily be applied to the existing technologies.

Preferably, the driving controller 180 stops the operation of the first-stage sense amplifier 130 in response to the output signals D1 and D1B of the second-stage sense amplifier 140.

The driving controller 180 controls an enable timing of the first-stage sense amplifier by controlling the pulse width of the control signal IOSTB1C in response to the output signals D1 and D1B of the second-stage sense amplifier 140.

A bias circuit is provided between the first-stage sense amplifier 130 and the second-stage sense amplifier 140 such that the second-stage sense amplifier can be continuously driven when the operation of the first-stage sense amplifier is stopped.

It is preferable that the driving controller 180 receive the output signals of the second-stage sense amplifier 140 via a driver such as an inverter, not directly. This will be described later in detail.

An operation of the I/O sense amplifier in accordance with the present invention will be described with reference to FIG. 3.

Referring to FIG. 3, the present invention is different from the prior art in that the driving controller 180 is further included. The design of an additional circuit for receiving the output signals D1 and D1B of the second-stage sense amplifier may be changed in various manners.

The driving controller 180 receives the output signals D1 and D1B of the second-stage sense amplifier 140 and determines whether or not the second-stage sense amplifier 140 performs the sensing operation sufficiently. When the sensing operation is not performed sufficiently, the driving controller 180 transfers the first control signal IOSTB1 as the final control signal IOSTB1C. Then, when the sensing operation is performed sufficiently, the driving controller 180 interrupts the first control signal IOSTB1 so that the operation of the first-stage sense amplifier 130 is stopped.

By stopping the operation of the first-stage sense amplifier 130 using the output signals of the second-stage sense amplifier 140, the time period when the first-stage sense amplifier 130 and the second-stage sense amplifier 140 are driven together can be reduced to the minimum within an allowable range.

Figure 4:
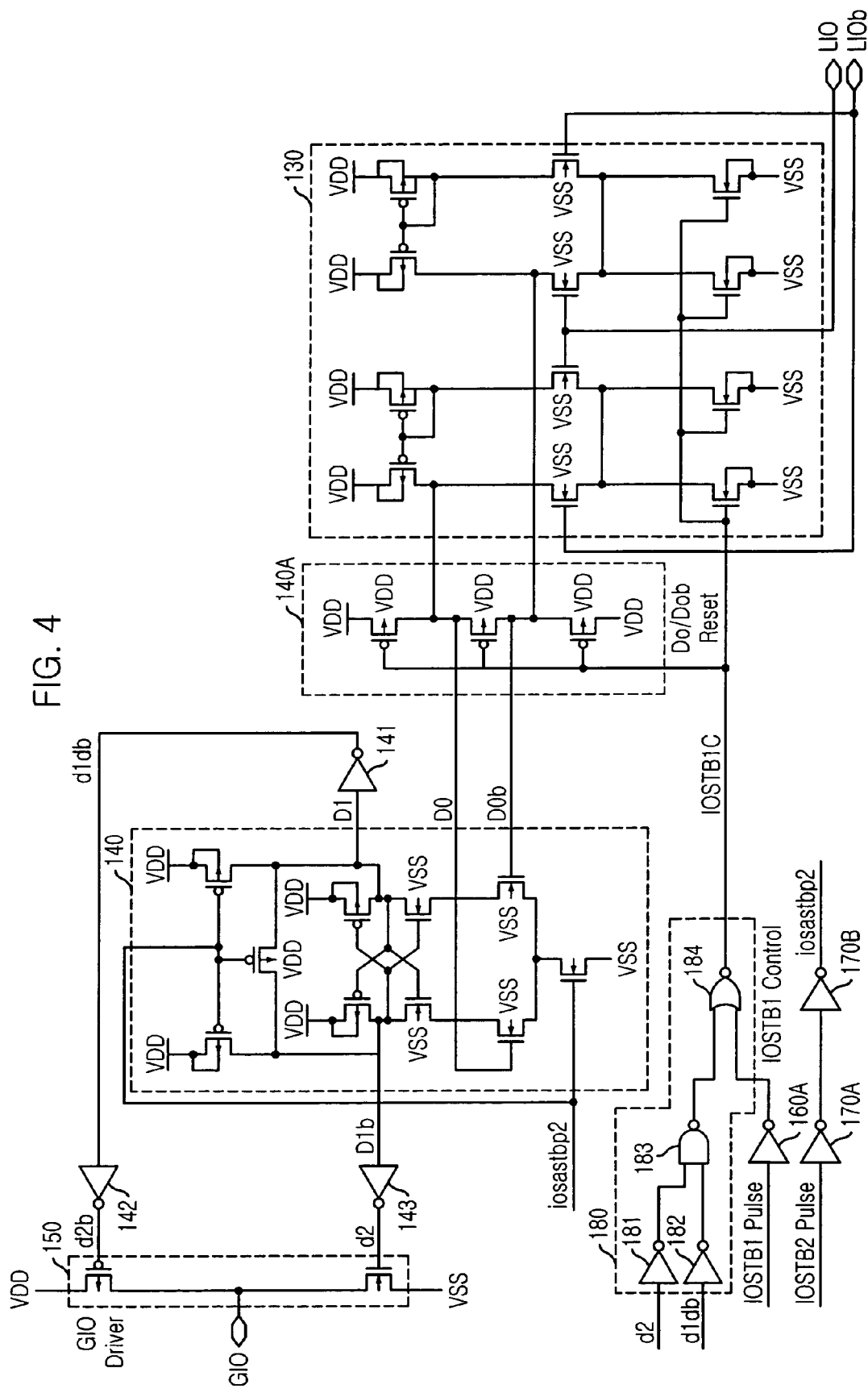
FIG. 4 is a circuit diagram of the I/O line sense amplifier of FIG. 3.

FIG. 4 is a circuit diagram of the I/O line sense amplifier of FIG. 3.

Referring to FIG. 3, the first-stage sense amplifier 130 is configured with two differential amplifying type circuits. The differential amplifying type circuits are driven by NMOS transistors (four NMOS transistors in FIG. 4) receiving the output signal IOSTB1C of the driving controller 180, and output the signals D0 and D0B. Although the first-stage sense amplifier 130 may be configured with a single differential amplifying circuit, it is preferable that the first-stage sense amplifier 130 is configured with two differential amplifying circuits. In this case, the reliability of the output signals D1 and D1B is improved.

The second-stage sense amplifier 140 is configured with a cross-coupled type amplifying circuit driven by the second control signal IOSTB2.

At the output terminals D1 and D1B of the second-stage sense amplifier 140, a first output path and a second output path are provided. The first output path is configured with inverters 141 and 142, and the second output path is configured with an inverter 143.

A reset circuit 140A for resetting the output signals D0 and D0B of the first-stage sense amplifier 130 is provided between the second-stage sense amplifier 140 and the first-stage sense amplifier 130. The reset circuit 140A includes three PMOS transistors configured to commonly receive the output signal IOSTB1C of the driving controller 180. That is, a first PMOS transistor supplies a power supply voltage VDD to the D0 line, a second PMOS transistor is connected between the D0 line and the D0B line, and a third PMOS transistor supplies the power supply voltage VDD to the D0B line. An operation of the reset circuit 140A will be described below.

The global I/O driver 150 is connected on a path where the output signals D1 and D1B of the second-stage sense amplifier 140 are transferred, and outputs data to the global I/O lines GIO. The global I/O driver 150 includes a pull-up PMOS transistor and a pull-down NMOS transistor. The pull-up PMOS transistor is connected to a D2B signal passing through the first output path of the second-stage sense amplifier 140, and the pull-down NMOS transistor is connected to a D2 signal passing through the second output path of the second-stage sense amplifier 140.

Although not shown in FIG. 4, the first control signal generator 160 can be implemented with the same structure as that of the prior art. It can be seen from FIG. 4 that the first control signal IOSTB1 from the first control signal generator 160 is input to the driving controller 180 through an inverter 160A.

Although not shown in FIG. 4, the second control signal generator 170 can be implemented with the same structure as that of the prior art. It can be seen from FIG. 4 that the second control signal IOSTB2 is input to the second-stage sense amplifier through inverters 170A and 170B. The second control signal IOSTB2 from the second-stage sense amplifier 170 may be directly input to the second-stage sense amplifier 140, or may be input through the two inverters 170A and 170B. The two inverters 170A and 170B may be used as a delay circuit for adjusting the signal timing, or a driver for amplifying the signals.

The driving controller 180 includes a first inverter 181, a second inverter 182, a NAND gate 183, and a NOR gate 184. The first inverter 181 receives the output signal D2 of the second-stage sense amplifier 140, and the second inverter 182 receives the output signal D1DB of the second-stage sense amplifier 140. The NAND gate 183 receives output signals of the first and second inverters 181 and 182, and the NOR gate 184 receives an output of the NAND gate 183 and the first control signal IOSTB1.

In order not to influence the operation characteristics of the second-stage sense amplifier 140, the driving controller 180 does not directly receive the output signals D1 and D1B of the second-stage sense amplifier 140, but receives the signals D2 and D1DB passing through the inverters 141 and 143. That is, the output signals D1 and D1B are not directly fed back to the driving controller 180, but the signals passing through at least one stage are input thereto. In FIG. 4, the signals D2 and D1DB passing through one stage are input.

The output signals of the driving controller 180 are maintained at the same level before the second-stage sense amplifier 140 performs the sensing operation, but the output signals have different levels when the sensing operation is completed. That is, the driving controller 180 is designed to control the first-stage sense amplifier 130 after determining whether the second-stage sense amplifier 140 performs the sensing operation sufficiently.

More specifically, when the output signals D2 and D1DB of the second-stage sense amplifier 140 are all in logic level LOW, it means that the second-stage sense amplifier 140 does not complete the sensing operation. In this case, the first control signal IOSTB1 passes through the inverter 160A and the NOR gate 184 and is then transferred as the control signal IOSTB1C for the first-stage sense amplifier 130. On the contrary, when one of the output signals D2 and D1DB of the second-stage sense amplifier 140 changes into logic level HIGH, it means that the second-stage sense amplifier 140 completes the sensing operation. Therefore, the driving controller 180 shifts the level of the control signal IOSTB1C, so that the first-stage sense amplifier 130 will cease operation. In FIG. 4, when the output signal of the NAND gate 183 of the driving controller 180 changes into logic level HIGH, the output signal of the NOR gate 184 is disabled. That is, the NOR gate 184 is disabled to logic level LOW, regardless of the pulse level of the first control signal IOSTB1. Then, the driving controller 180 turns off the four NMOS transistors of the first-stage sense amplifier 130, thereby stopping the operation of the first-stage sense amplifier 130.

When the operation of the first-stage sense amplifier 130 is stopped, the reset circuit 140A allows the second-stage sense amplifier 140 to operate normally. That is, the reset circuit 140A makes the input terminals D0 and D0B of the second-stage sense amplifier have the VDD level. It can be seen from FIG. 4 that three PMOS transistors of the reset circuit 140A are all turned on when the driving controller 180 outputs the control signal IOSTB1C of logic level LOW.

Figure 1:
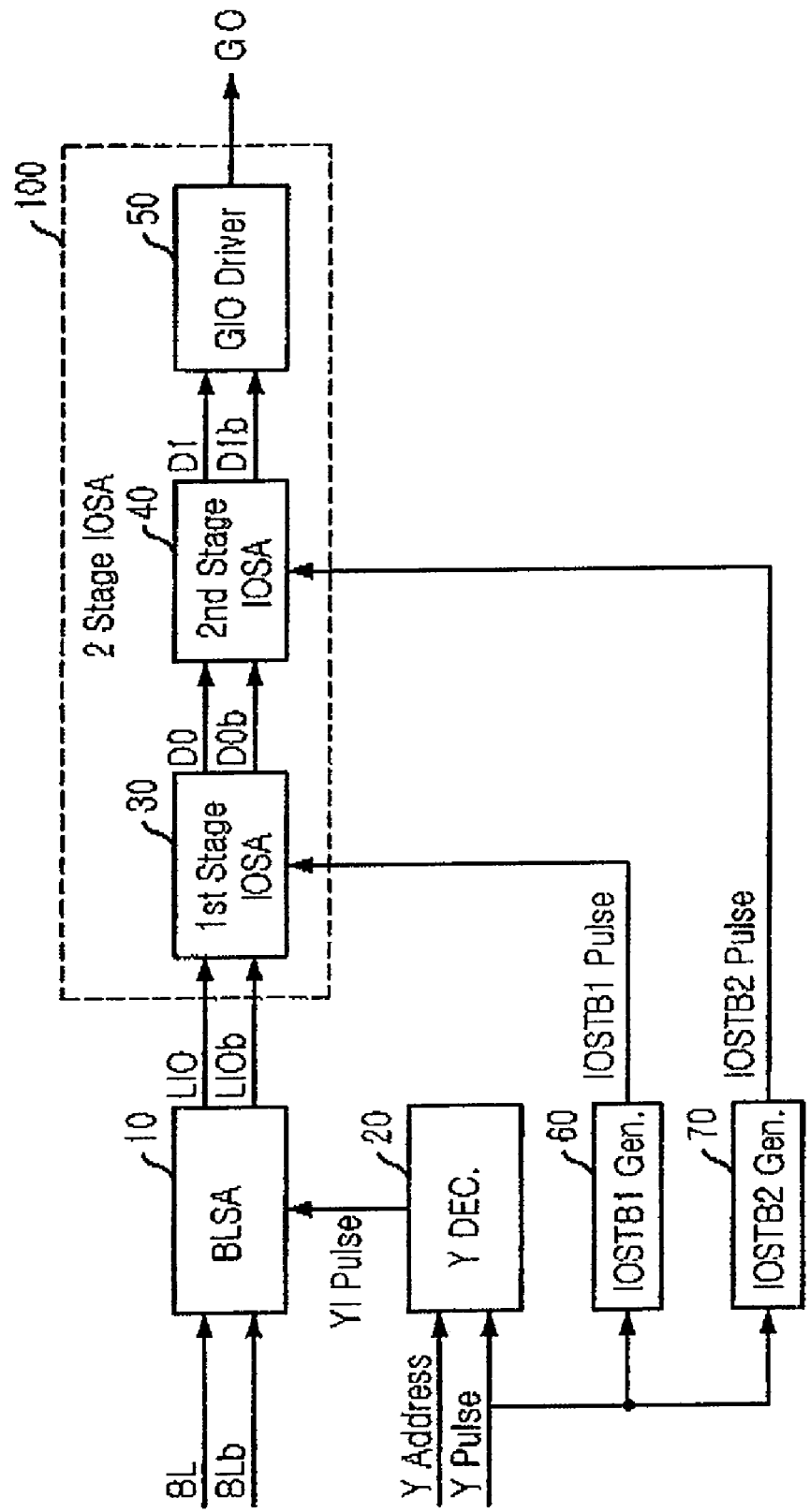
FIG. 1 is a block diagram of a conventional two-stage I/O line sense amplifier.
Figure 2:
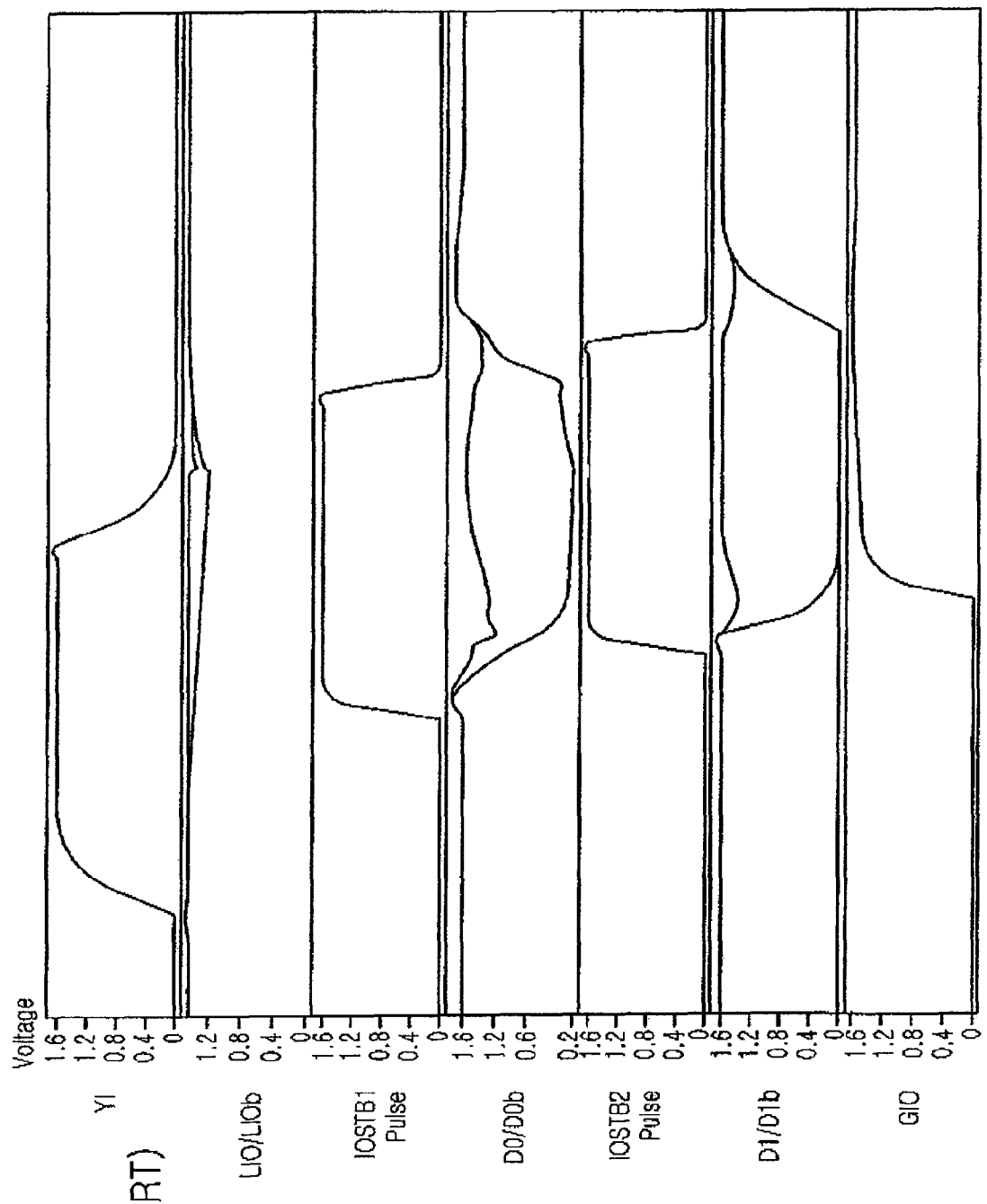
FIG. 2 is a timing diagram of the I/O line sense amplifier of FIG. 1.
Figure 5:
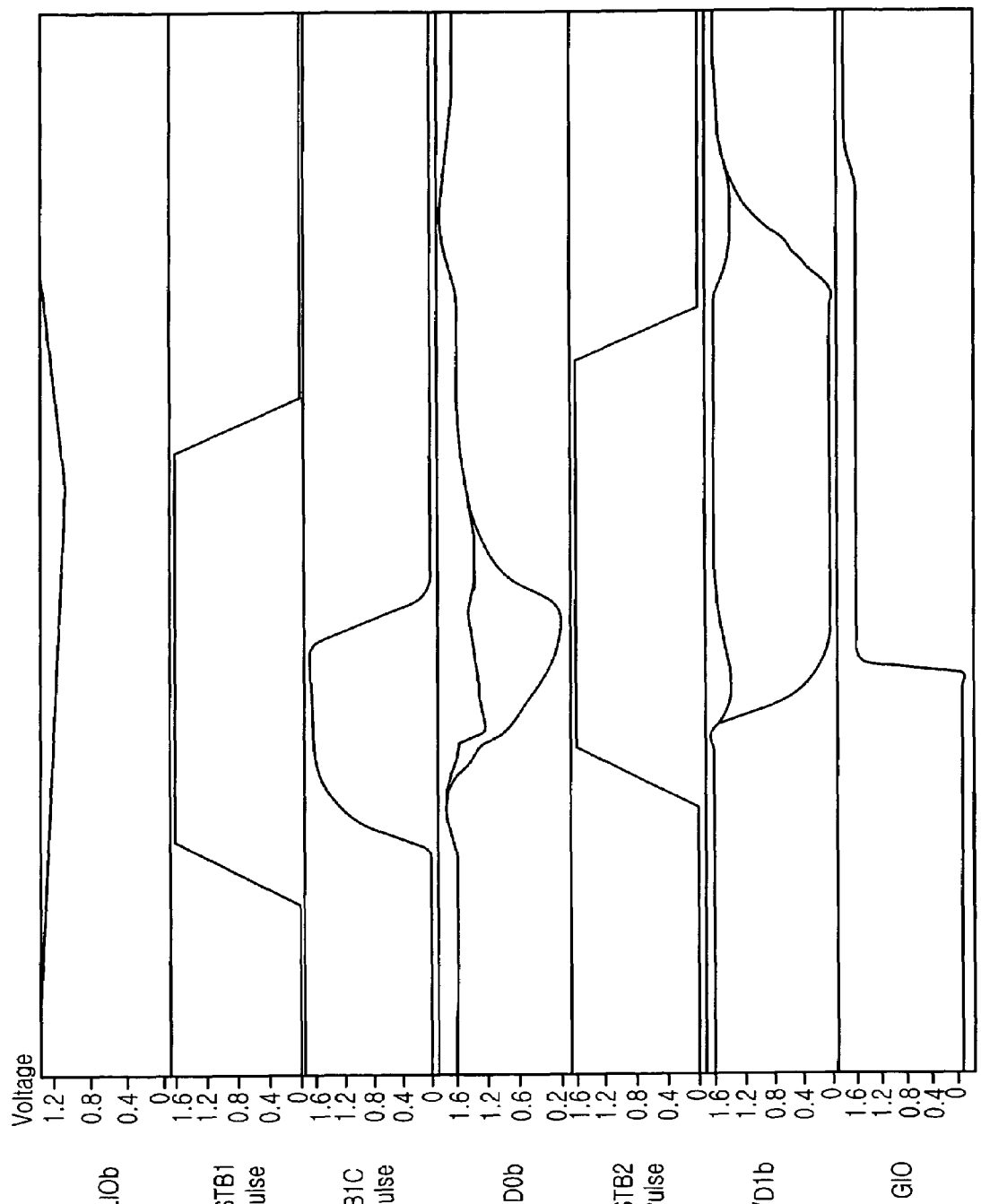
FIG. 5 is a timing diagram of the I/O line sense amplifier of FIGS. 3 and 4.

FIG. 5 is a timing diagram of the I/O line sense amplifier illustrated in FIGS. 3 and 4. Compared with the timing diagram of FIG. 2, although the first and second control signals IOSTB1 and IOSTB2 seem to be identical to each other, the pulse width of the control signal IOSTB1C for controlling the first-stage sense amplifier 130 is shorter and the operation period of the first-stage sense amplifier 130 is shorter. The operation characteristic of the second-stage sense amplifier 140 is identical to the waveform of FIG. 2.

When the two-stage I/O line sense amplifier is controlled only using the first and second control signals IOSTB1 and IOSTB2 having the fixed pulse width, the power is wasted during the operation of the sense amplifiers because margin for the sensing operation must be given for the preparation of process/voltage/temperature (PVT) change. Because the first sense amplifier is controlled using the feedback output signal of the second sense amplifier in the present invention, the operation of the sense amplifiers can be secured without unnecessary power consumption.

Also, the unnecessary operation of the sense amplifier can be prevented by efficiently controlling the operation of the I/O line sense amplifiers in the read operation, thereby remarkably reducing the unnecessary power consumption. In addition, the time period when the two-stage sense amplifier is driven together can be reduced to the minimum within an allowable range.

The present application contains subject matter related to Korean patent application No. 2005-90863 and 2005-118918 filed in the Korea Patent Office on Sep. 28, 2005 and Dec. 7, 2005, respectively, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A semiconductor memory device comprising:
an input/output (I/O) line;
a first sense amplifier connected to the I/O line to amplify a signal applied on the I/O line;
a second sense amplifier for sensing and amplifying an output signal of the first sense amplifier; and
a controller for controlling the first sense amplifier by feeding back an output signal of the second sense amplifier into the first sense amplifier,
wherein the first sense amplifier is inactivated while the second sense amplifier amplifies the output signal of the first sense amplifier and after the second sense amplifier completes an operation sensing the output signal of the first sense amplifier.

2. The semiconductor memory device of claim 1, wherein the controller stops an operation of the first sense amplifier in response to the output signal of the second sense amplifier.

3. The semiconductor memory device of claim 2, further comprising a bias circuit between the first sense amplifier and the second amplifier, the bias circuit being configured to continue the driving of data inputs of the second sense amplifier when the operation of the first sense amplifier is stopped.

4. The semiconductor memory device of claim 1, wherein the controller receives the output signal of the second sense amplifier not directly but via a driver.

5. The semiconductor memory device of claim 1, wherein the first I/O line is a local I/O line.

6. A semiconductor memory device comprising:
an I/O line;
a first sense amplifier connected to the I/O line to amplifier a signal applied on the I/O line;
a second sense amplifier for sensing and amplifying an output signal of the first sense amplifier; and
an enable timing controller for controlling a driving of the first sense amplifier in response to an output signal of the second sense amplifier,
wherein the first sense amplifier is inactivated while the second sense amplifier amplifies the output signal of the first sense amplifier and after the second sense amplifier completes an operation sensing the output signal of the first sense amplifier.

7. The semiconductor memory device of claim 6, wherein the enable timing controller stops an operation of the first sense amplifier in response to the output signal of the second sense amplifier.

8. The semiconductor memory device of claim 7, further comprising a bias circuit between the first sense amplifier and the second amplifier, the bias circuit being configured to continue the driving of data inputs of the second sense amplifier when the operation of the first sense amplifier is stopped.

9. The semiconductor memory device of claim 6, wherein the enable timing controller receives the output signal of the second sense amplifier not directly but via a driver.

10. The semiconductor memory device of claim 6, wherein the I/O line is a local I/O line.

11. A semiconductor memory device comprising:
an input/output (I/O) line;
a first sense amplifier connected to the I/O line to amplify a signal applied on the I/O line in response to a first control signal;
a second sense amplifier for sensing and amplifying an output signal of the first sense amplifier in response to a second control signal, and
a disabling unit for disabling the first control signal in response to an output signal of the second sense amplifier,
wherein the first sense amplifier is inactivated while the second sense amplifier amplifies the output signal of the first sense amplifier and after the second sense amplifier completes an operation sensing the output signal of the first sense amplifier.

12. The semiconductor memory device of claim 11, wherein the disabling unit stops an operation of the first sense amplifier in response to the output signal of the second sense amplifier.

13. The semiconductor memory device of claim 12, further comprising a bias circuit between the first sense amplifier and the second amplifier, the bias circuit being configured to continue the driving of data inputs of the second sense amplifier when the operation of the first sense amplifier is stopped.

14. The semiconductor memory device of claim 11, wherein the disabling unit receives the output signal of the second sense amplifier not directly but via a driver.

15. The semiconductor memory device of claim 11, wherein the first I/O line is a local I/O line.

16. A semiconductor memory device comprising:
a first sense amplifier for primarily sensing and amplifying data applied on an I/O line;
a second sense amplifier for secondarily sensing and amplifying an output signal of the first sense amplifier;
a first control signal generator for receiving a column pulse signal and generating a first control signal to the first sense amplifier;
a second control signal generator for receiving the column pulse signal and generating a second control signal to the second sense amplifier; and
a driving controller for controlling a driving of the first sense amplifier in response to an output signal of the second sense amplifier,
wherein the first sense amplifier is inactivated while the second sense amplifier amplifies the output signal of the first sense amplifier and after the second sense amplifier completes an operation sensing the output signal of the first sense amplifier.

17. The semiconductor memory device of claim 16, wherein the I/O line is a local I/O line.

18. The semiconductor memory device of claim 16, further comprising a global I/O line driver for outputting data to a global I/O line in response to the output signal of the second sense amplifier.

19. The semiconductor memory device of claim 16, wherein the first sense amplifier is configured with a differential circuit that is driven according to the output signal of the driving controller.

20. The semiconductor memory device of claim 16, wherein the second sense amplifier is configured with a cross-coupled circuit that is driven according to the output signal of the second control signal generator.

21. The semiconductor memory device of claim 16, further comprising a reset circuit disposed between the second sense amplifier and the first sense amplifier to reset the output signal of the first sense amplifier.

22. The semiconductor memory device of claim 16, wherein the second sense amplifier includes a first output path and a second output path for driving an output signal of the second sense amplifier.

23. The semiconductor memory device of claim 22, wherein the driving controller directly receives signals passing through the first and second output paths of the second sense amplifier.

24. The semiconductor memory device of claim 23, wherein the signals are input to the driving controller after passing through at least one inverter stage.

25. The semiconductor memory device of claim 16, wherein the driving controller determines whether the second sense amplifier sufficiently performs a sensing operation by using two output signals of the second sense amplifier, and controls the driving of the first sense amplifier.

26. The semiconductor memory device of claim 25, wherein when the two output signals of the second sense amplifier have different levels, the driving controller stops an operation of the second sense amplifier.

27. The semiconductor memory device of claim 16, wherein the output signal of the second control signal generator is amplified through two inverters and transferred to the second sense amplifier.

28. The semiconductor memory device of claim 16, wherein the first sense amplifier is configured with two differential circuits that are driven according to the output signal of the driving controller, the output signals of the two differential circuits being two output signals of the first sense amplifier.

* * * * *